United States Patent [19]
Behrend

[11] 3,955,155
[45] May 4, 1976

[54] AMPLITUDE MODULATION SYSTEM

[75] Inventor: William Louis Behrend, Pittsburgh, Pa.

[73] Assignee: RCA Corporation, New York, N.Y.

[22] Filed: Dec. 23, 1974

[21] Appl. No.: 536,003

[52] U.S. Cl............................. 332/1; 325/136; 332/41; 332/45; 332/48; 358/23
[51] Int. Cl.².......................................... H03C 1/52
[58] Field of Search................ 332/23 R, 23 A, 44, 332/45, 1, 31 R, 31 T, 37 R, 38, 37 D, 48; 358/23-25; 325/50, 136, 137

[56] References Cited
UNITED STATES PATENTS

| | | | |
|---|---|---|---|
| 3,176,246 | 3/1965 | Boiten | 332/23 X |
| 3,229,232 | 1/1966 | Sosin | 332/45 |
| 3,443,229 | 5/1969 | Becker | 325/136 X |
| 3,559,070 | 1/1971 | Sharpe | 325/136 |
| 3,737,809 | 6/1973 | Parkyn | 332/41 |

*Primary Examiner*—Siegfried H. Grimm
*Attorney, Agent, or Firm*—Edward J. Norton; Robert L. Troike

[57] ABSTRACT

An amplitude modulation system suitable for use in television broadcasting is described. A video signal amplitude modulates a radio frequency carrier signal. The amplitude modulated signal is then filtered by a delay equalized vestigial sideband filter. The delay equalized amplitude modulated signal from the output of the vestigial sideband filter is envelope detected over a first path and is amplitude limited over a second path. The amplitude limited signal is applied to first and second phase modulators. The envelope detected signal is processed by a video processor to one of the phase modulators providing a phase shift at the one phase modulator equal to the arc cosine of the normalized envelope detected signal. The envelope detected signal is also processed by a video processor to the second phase modulator to provide a phase shift at the second phase modulator equal to the minus (−) arc cosine of the normalized envelope detected signal. The outputs from the two phase modulators are combined to provide an amplified, amplitude modulated, delay equalized vestigial sideband filtered signal.

15 Claims, 11 Drawing Figures

- MODULATION RANGE = 68° FROM PEAK OF SYNC LEVEL TO WHITE LEVEL
- PEAK OF SYNC LEVEL = 90°
- WHITE LEVEL = 22°

FIG. 9

- PEAK OF SYNC DIFFERENCE = 30°
- WHITE LEVEL DIFFERENCE = 166°

FIG. 8

- MODULATION RANGE = 68° FROM PEAK OF SYNC LEVEL TO WHITE LEVEL
- WHITE LEVEL = 90°
- PEAK OF SYNC LEVEL = 22°

AMPLITUDE MODULATION SYSTEM

BACKGROUND OF THE INVENTION

This invention relates to amplitude modulation systems and more particularly to vestigial sideband amplitude modulation systems such as are used in television broadcasting transmitters.

In efforts to use present state of the art solid state linear amplifiers in the low-level power drive stages of a television transmitter, these solid state amplifiers produce large amounts of undesired incidental RF phase modulation. By the use of a phase-to-amplitude modulation system, the video signal can be amplified, in power, with non-linear amplifiers (signal at constant level as a function of time) at the low level drive stages up to the final processing of the amplified, transmitter output amplitude modulation signal.

A phase-to-amplitude modulation system is described in a paper published in the Electronics Magazine of Sept. 1950 on pages 102 through 106. The paper is entitled "Phase to Amplitude Modulation" and is by William E. Evans, Jr. Although Evans suggests this type of system for television broadcasting, applicant knows of no use of this form of modulation in television broadcasting other than the referenced experimental use. Evans does not discuss the use of vestigial sideband filtering, and, since such filtering is conventionally done at high power levels just before coupling to the antenna, it is assumed that Evans contemplated the provision of sideband filtering at high power levels after the combiner. As will be discussed, it is desirable, particularly from the standpoint of filter cost and/or performance, that vestigial sideband filtering be done at a low power level. Further, it is desirable that all signal processing be done at a fixed frequency with translation to final television channel frequencies. This approach permits the use of a common signal processor for all television channels, lowering total cost and increasing reliability.

BRIEF DESCRIPTION OF THE INVENTION

A vestigial sideband amplitude modulation system is provided by amplitude modulating a radio frequency carrier signal by the intelligence signal. The amplitude modulated signal is filtered by a delay equalized vestigial sideband filter. This filtered signal is amplitude limited over a first path to a phase modulating means. The amplitude level of the envelope of the filtered signal is detected, and the detected signal is applied to the phase modulating means. The phase modulating means provides at a first output thereof the amplitude limited signal phase shifted by an amount equal to the arc cosine of the amplitude of the envelope detected signal normalized with unity as the maximum possible output. The phase modulating means provides at a second output thereof the amplitude limited signal phase shifted by an amount equal to the minus (−) arc cosine of the amplitude of the envelope detected signal normalized with unity as the maximum possible output. The amplified phase modulated outputs from the phase modulating means are combined to provide a high power delay equalized vestigial sideband filtered amplitude modulated signal.

DETAILED DESCRIPTION

A detailed description of an embodiment of the present invention follows in conjunction with the drawing wherein.

Figure 1:
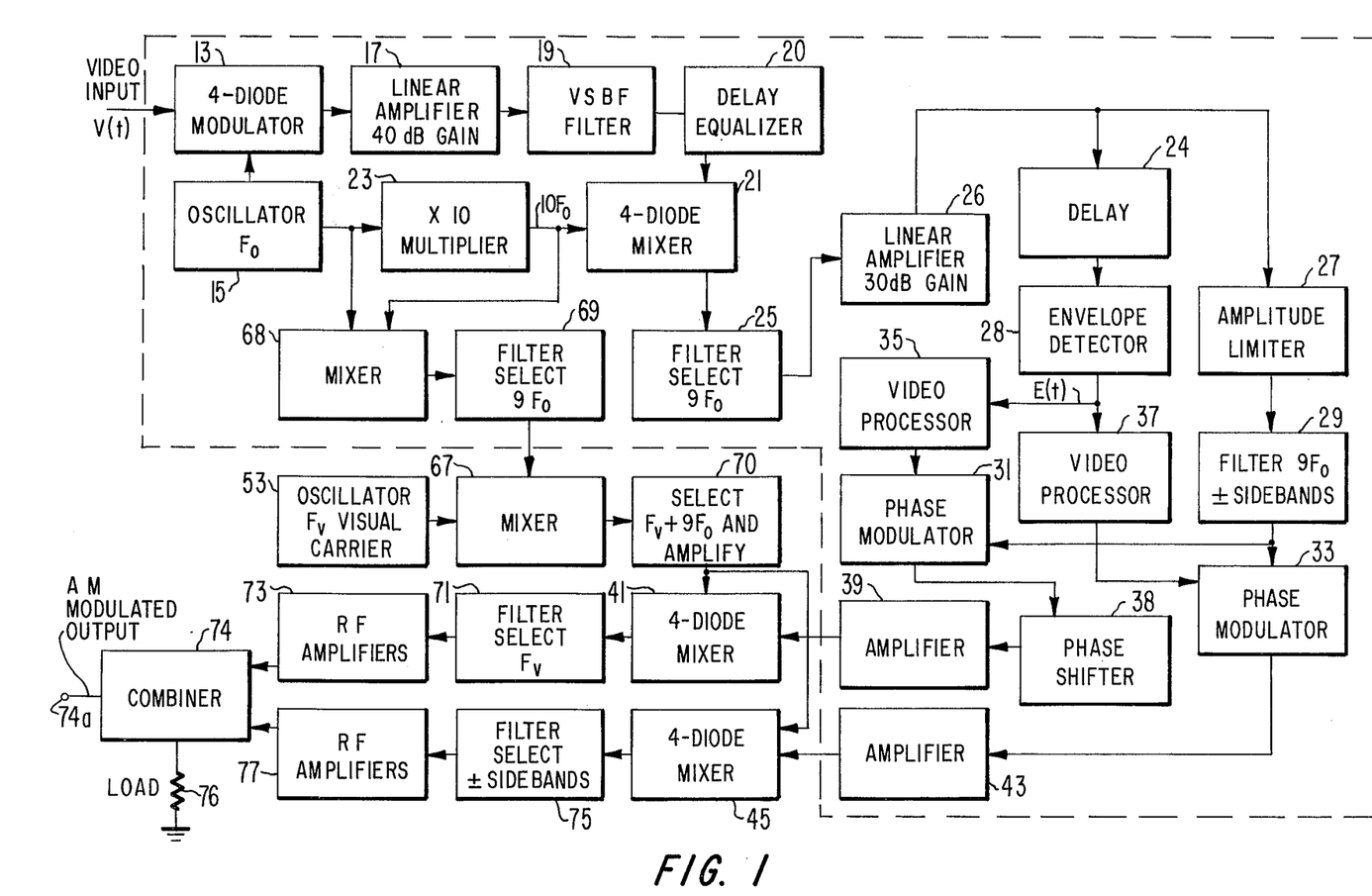
FIG. 1 is a block diagram of a phase-to-amplitude modulation system according to one embodiment of the present invention.

FIG. 1 is a block diagram of a phase-to-amplitude modulation system according to one preferred embodiment of the present invention suitable for use in a television transmitter. A local signal at a radio frequency (RF) $F_0$ is amplitude modulated at modulator 13 with a video signal $V(t)$ to be transmitted. Signal $F_0$ is provided by a source 15 which may, for example, be a sine wave oscillator at a frequency of 16 MHz (megahertz). The AM modulator 13 may be a four diode modulator such as the type sold by Relcom of Palo Alto, Calif. and marketed as Model Number M9B. The resultant amplitude modulated signal $V(t) \sin \omega_0 t$ is applied through a linear amplifier 17 to a vestigial sideband filter 19. Amplifier 17 may provide, for example, about 40 db gain. Vestigial sideband filter 19 may be, for example, a seven pole Chebyshev type filter with the 1 db bandwidth extending from −0.62 MHz to +4.18 MHz; with the 3 db bandwidth extending from −0.72 MHz to 4.28 MHz; and with the 19 db bandwidth extending from −1.25 MHz to +4.75 MHz with a maximum ripple of 0.01 db and with a 2 db insertion loss. The term −0.62 MHz refers to the lower sideband which is 0.62 MHz below the carrier frequency and the term +4.18 MHz refers to the upper sideband frequency at 4.18 MHz above the carrier frequency. To achieve better lower sideband response and greater attenuation at −1.25 MHz and +4.75 MHz, an eight pole Chebyshev type filter may be used. It is important that group delay be substantially equalized over the band of frequencies passed by the filter. This may be achieved by the filter including an eight section equalizer 20 having a response characteristic with a tolerance of less than ±20 nanoseconds over the band of frequencies from 0.5 MHz below the carrier to +4.0 MHz above the carrier frequency and by a tolerance of less than ±40 nanoseconds over the frequencies from 0.75 MHz below the carrier frequency to 4.1 MHz above the carrier frequency. The output of the filter 19 and delay equializer 20 may be represented as $$E(t) \sin [\omega_0 t + \beta(t)],$$

where $\beta(t)$ is the phase modulation of carrier, $F_0$, caused by vestigial sideband filtering of the double sideband signal $V(t) \sin \omega_0 t$. This delay equalized vestigial sideband filtered signal is the wanted transmitter output signal except that the power is low and the carrier frequency is not the final TV channel frequency. This filtered signal is applied to an up-converter mixer 21.

Oscillator 15, in addition to applying signals at $F_0$ to modulator 13, also applies these signals to a times 10 frequency multiplier 23. Signals at 10 $F_0$ (160 Mhz, for example) are applied from the multiplier 23 to up-converting diode mixer 21. The up-converting mixer 21 mixes the $F_0$ and 10 $F_0$ signals and passes these signals through a filter 25 which selects the frequency 9 $F_0$ (144 MHz, for example), plus the upper sideband and lower vestigial sideband signal, to provide at the output thereof a signal represented by $$E(t) \sin [9\omega_0 t - \beta(t)].$$

Filter 25 may be, for example, a four pole Chebyshev type filter with 0.01 db ripple and a 3 db bandwidth of 13.7 MHz. The output signal from filter 25 is amplified by a linear processing amplifier 26 and is coupled via a first path to an amplitude limiter 27. The amplitude limiter 27 removes the AM modulation. A component of the limiter 27 output is the carrier $9F_0$ including phase modulation caused by the vestigial sideband filter 19. This amplitude limited signal passes through a band select filter 29 and may be represented as sin $[9\omega_0 t - \beta(t)]$. This signal is coupled equally divided to two phase modulators 31 and 33. The filter 29 passes signals at $9F_0\pm$ the sidebands. Filter 29 may be a two-pole Chebyshev type filter with 0.01 db ripple and a 3 db bandwidth of 48 MHz. Also, rejection type filters at harmonics of $9F_0$ may be used. The linear amplifier 26 provides, for example, 30 db gain.

The output signal from amplifier 26 is also coupled via a second path including a delay 24 to an envelope detector 28. The delay 24 adjusts the timing so that the signals applied and processed over the respective paths through the video processors 35 and 37 arrive at the phase modulators 31 and 33 at the same time as the signals applied and processed over the path through limiter 27 and filter 29. The envelope detector 28 detects the amplitude level of the vestigial sideband filtered signal to provide at the output thereof a signal [represented as $E(t)$] varying in amplitude as to the envelope of the vestigial sideband filtered signal. The output signal $E(t)$ from the envelope detector 28 is applied via the video processor 35 to phase modulator 31 and via video processor 37 to phase modulator 33. The envelope detector may include a high quality linear double sideband diode.

In this phase-to-amplitude modulation system, the two signals represented by sin $[9 \omega_0 t - \beta(t)]$ from the limiter 27 are separately phase shifted by phase modulators 31 and 33 and are then combined after amplification at a combiner 74. The relative phase between the two phase modulated signals determines the amplitude of the output signal from terminal 74a of the combiner. A maximum possible output signal from terminal 74a results if the phase shifted signals are combined in phase at the combiner 74, and a zero output signal at terminal 74a results if the two phase shifted signals are 180° out of phase. video processor 35 provides an output signal $A(t)$ for a given input signal $E(t)$ such that the phase shift produced at the phase modulator 31 is the arc cosine of the envelope detected signal $[E(t)]$ normalized with unity as the maximum possible signal output. The video processor 37 provides an output signal $-A(t)$ for an input signal $E(t)$ such that the phase shift produced at the phase modulator 33 is the minus (—) arc cosine of the envelope detected signal $E(t)$ normalized with unity as the maximum possible output.

Figure 2:
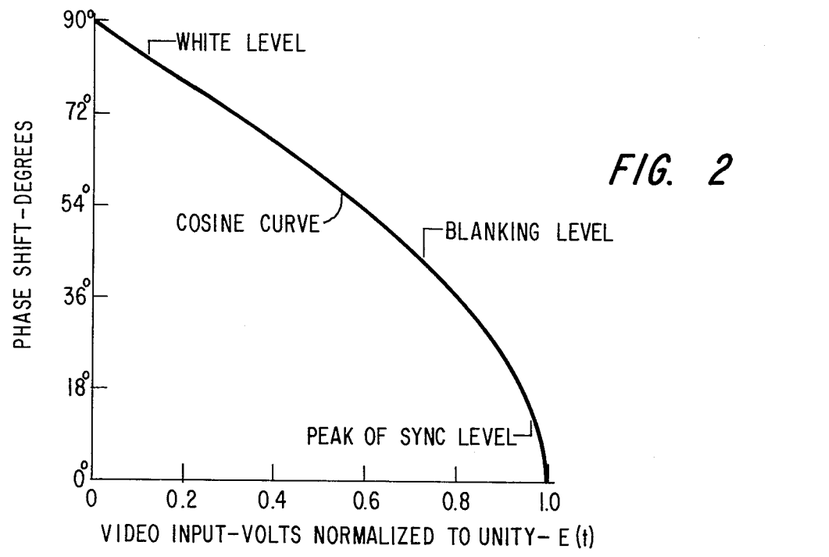
FIG. 2 is a plot of normalized video input vs. phase shift in degrees.

For example, referring to FIG. 2 there is illustrated a plot of the phase shift in degrees at a phase modulator for a signal $E(t)$ from the envelope detector normalized with unity (1.0) as the maximum possible output. This maximum possible output is that level from the envelope detector causing a 0° relative phase shift (zero phase difference between the two input signals to the combiner 74) and causing maximum possible output from the system. As the signal level $E(t)$ decreases toward zero as illustrated in FIG. 2, the phase shift produced at the modulators increases according to the cosine curve. When $E(t)$ is zero, the phase is shifted 90°. The phase shift produced at modulator 31 is of a negative sign, and the phase shift produced at modulator 33 is equal but of a positive sign. Therefore, as the signal level $E(t)$ decreases toward zero, the relative phase difference increases by twice the phase shift produced in either modulator. The output from the phase modulator 31 in this case may be represented generally as sin $[9 \omega_0 t - \beta(t) - \text{arc cos } E(t)]$. The output from the phase modulator 33 in this case may be represented generally as sin $[9 \omega_0 t - \beta(t) + \text{arc cos } E(t)]$.

The output from phase modulator 31 is coupled via a phase shifter 38 and a non-linear amplifier 39 to a mixer 41. The output from phase modulator 33 is coupled over a separate path including a non-linear amplifier 43 to a mixer 45. The output from mixer 41 is coupled to one input of combiner 74, and the output from mixer 45 is coupled over a second path to a second input of combiner 74. The adjustable phase shifter 38 is used to set the proper steady state phase difference between the signals at the combiner output terminal 74a coupled over the first path including phase modulator 31 and mixer 41, and the signals at the combiner output terminal 74a coupled over the second path including phase modulator 33 and mixer 45. The steady state adjustment is correct if, when the envelope detector 28 output is zero $[E(t) = 0$ or 0% modulation), the two signals at the terminal 74a of combiner 74 are 180° out of phase and the combiner output is zero. Also, as the signal from the envelope detector 28 increases, the phase difference between the two signals at the combiner output terminal 74a should correspondingly decrease, causing the output at the terminal 74a of the combiner 74 to increase.

The combiner 74 may be like that shown in FIG. 4 of the reference article of Evans Jr., in which the power is shifted between the antenna and the dummy load in accordance with the relative phase between the signals applied to the combiner. This combiner may, in a preferred embodiment, be an RCA 50 ohm Coaxial Coupler (Crossover type) MI-561536A purchased from RCA Corp., Camden, N.J. The mixer 45 is coupled to that input section of the combiner 74 which undergoes an extra −90° phase shift to the common output 74a of the combiner. This extra −90° relative phase shift should be allowed for by adjustment of the phase shifter 38.

At the mixers 41 and 45 the signals are converted to the final carrier frequency $F_1$ such that the output from mixer 41 may then be represented generally as $\sin[\omega_1 + \beta(t) + \arccos E(t)]$ and the output from mixer 45 may then be represented generally as $\sin[\omega_1 + \beta(t) - \arccos E(t)]$. The change in sign is due to taking the difference signal. The signals when combined at the combiner output terminal 74a may be represented generally by $2A\{E(t) \sin[\omega_1 t + \beta(t)]\}$, where 2A represents the amplitude doubling by the operation of the combiner.

In the system so far described, it has been assumed that the system will operate to provide the theoretically maximum possible power output. As can be seen in FIG. 2, a cosine curve is not linear overall. As the video input voltage approaches the maximum input level normalized at unity, there is an increasingly rapid change in phase shift for small change in the video input. In a specific television broadcasting system according to the embodiment of FIG. 1 and to be described in the following paragraphs, this difficulty in video shaping is overcome by arranging the system such that maximum useable power output from the combiner terminal 74a occurs when there is a 30° phase difference between the two signals combined at the output of the combiner 74. Remaining power is coupled to the absorption load 76. Maximum useable power output at terminal 74a occurs when a peak-of-sync level signal is detected at detector 28. The peak-of-sync level operating point is indicated on the cosine curve of FIG. 2. The operating points for the blanking signal level and for the white signal level are also shown in FIG. 2. In the preferred embodiment to be described, minimum power at terminal 74a occurs when a white signal level is detected at detector 28. In this case, the phase difference between the two signals at the terminal 74a is 166°, with 12.5% of the peak of sync voltage being coupled from the output terminal 74a. The phase of the resultant signal at the terminal 74a is centered between the phase of the two combined signals.

Figure 3:
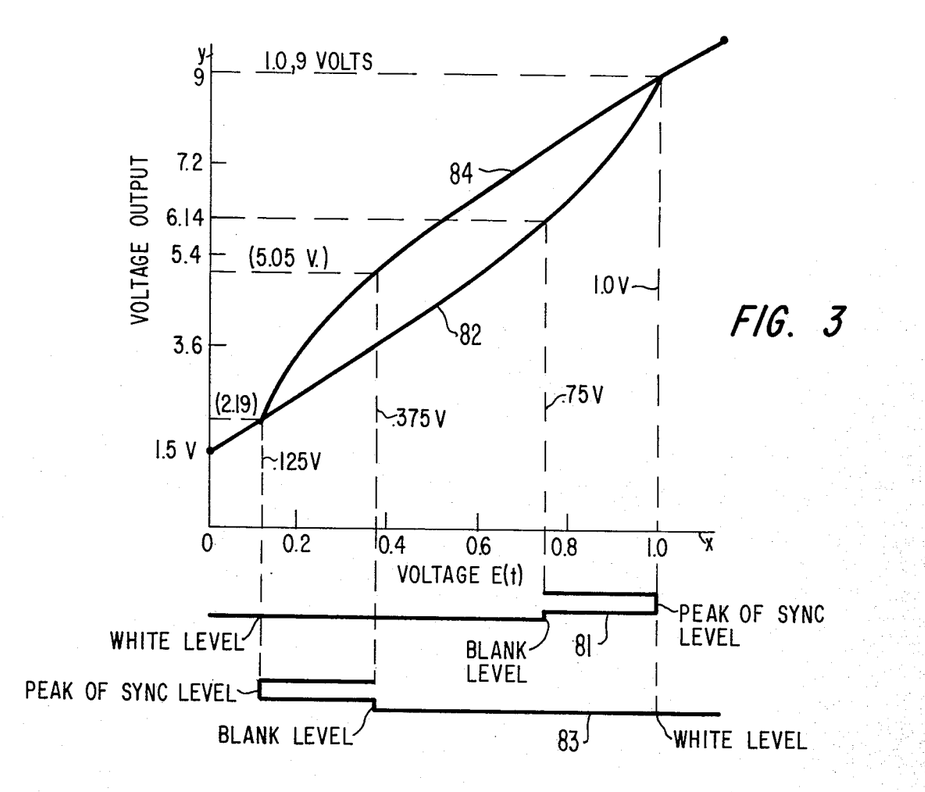
FIG. 3 is a plot of voltage input vs. voltage output from the video processors in FIG. 1.

Referring to FIG. 3, the signal 81 represents the signal $E(t)$ from the envelope detector 28 applied to the video processor 35. The signal 81 varies in the illustrated example in amplitude from 0 volts to 1.0 volts. When there is no envelope signal, the output from processor 35 is 1.5 volts. The 0.125 volt input signal level to the processor 35 in the white signal information level, the 0.75 volt input signal level to the processor is the blanking signal information level and the 1.0 volt input signal level is the peak-of-sync information level. As the signal at the input varies from the white signal information level of 0.125 volts to the peak-of-sync level of 1.0 volt along the x axis of FIG. 3, the video processor 35 operates as per curve 82 to provide between 2.19 volts to 9 volts output. For example, with a blanking level input of 0.75 volts, an output $A(t)$ of 6.14 volts is provided. A 2.19 volt output from the video processor 35 occurs in response to the white signal level. For an input peak-of-sync level of 1.0 volt, an output of 9 volts is provided. The actual output voltage required from a processor, is that required by the following phase modulator to achieve the proper phase shift. For example, the 9 volts output for a peak-of-sync level signal will produce 90° phase shift in the phase modulator 31 to follow. If a different phase modulator selected for use in a given application produces 90° phase shift with only 4 volts, then the output for a peak-of-sync level signal from the processor 35 need only be 4 volts.

The output signal $E(t)$ from the envelope detector 28 is inverted in video processor 37 and appears when inverted as signal 83 in FIG. 3. At the peak-of-sync level, the voltage $E(t)$ is at a 0.125 volt level, for example. As the input signal goes toward the white signal level, the voltage level increases to 1 volt. The level of the input signal at blanking for this example is 0.375 volts. The signal at the output of the video processor 37 for the signal 83 is determined by curve 84. For an input signal at peak-of-sync level, the output from the processor 37 is 2.19 volts. For a signal at the blanking level of 0.375 volts, the output from the processor 37 is 5.05 volts. For a signal of minimum white level of 1 volt, the output from processor 37 is approximately 9 volts.

The video processor 35 and the video processor 37 provide the translation described above, for example, by a combination of parallel series circuits with each circuit consisting of a diode in series with a resistor. The diodes are biased to conduct a different signal levels. The load resistance is at a minimum with all diodes conducting and at a maximum with all diodes nonconducting. Thus, there may be eight series circuits, each including a diode in series with a resistance and each one adjusted to conduct at different signal levels. Six of the series circuits are at fixed biases and two are at adjustable biases. The adjustable biases are chosen to be at each end of the characteristic such as at the white signal level end and at the peak-of-sync signal level end. The adjustable biases are to accommodate for the curvature in the phase versus voltage characteristic of the phase modulator operated from the processor. Other examples of similar circuits which may be used to provide the video processing described can be found in the following references: Television Engineering Handbook by D. Fink, pp. 5–50, McGraw-Hill; Fundamentals of Television Engineering by Glenn M. Glassford, p. 500, McGraw-Hill; and Introduction to Solid-State Television Systems by Gerald L. Hansen, p. 137–138, Prentice-Hall.

Figure 4:
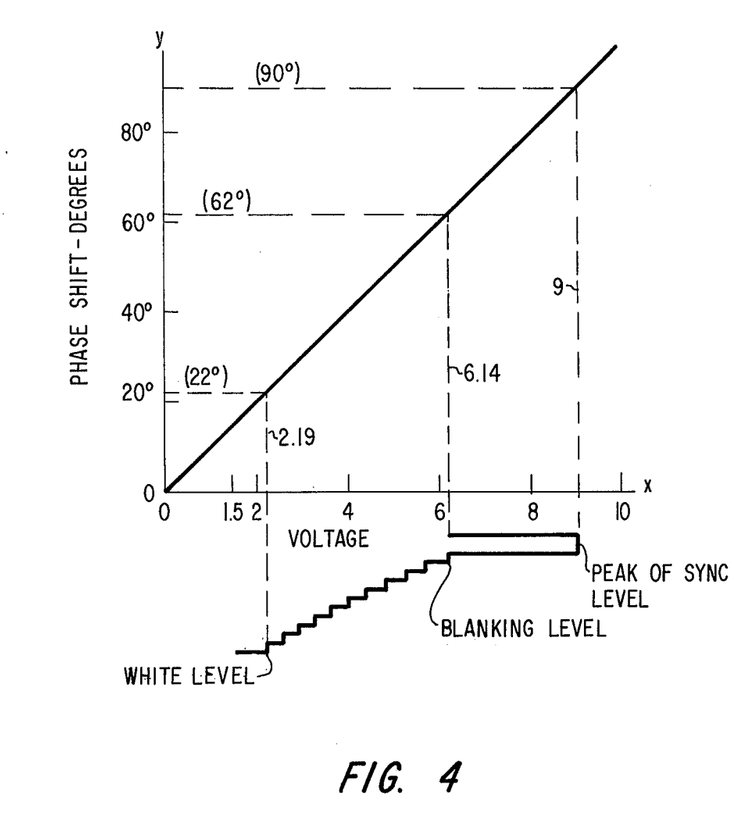
FIG. 4 is a plot of voltage input vs. phase shift of phase modulator 31 in FIG. 1.

Referring to FIG. 4, there is illustrated the voltage versus phase characteristic of the phase modulator 31. The 9 volts from the peak-of-sync level signal produced at the output of the video processor 35 causes a phase shift of 90° in the phase modulator 31. The 6.14 volts from the video processor 35 indicative of a blanking level signal produces 62° phase shift. The 2.19 volts from the processor 35 associated with a minimum white level signal produces about 22° phase shift in the phase modulator 31. The steps between the white level and blanking level in FIG. 4 represent signal intelligence information levels which produce a phase shift in the range 22° to 62°.

Figure 5:
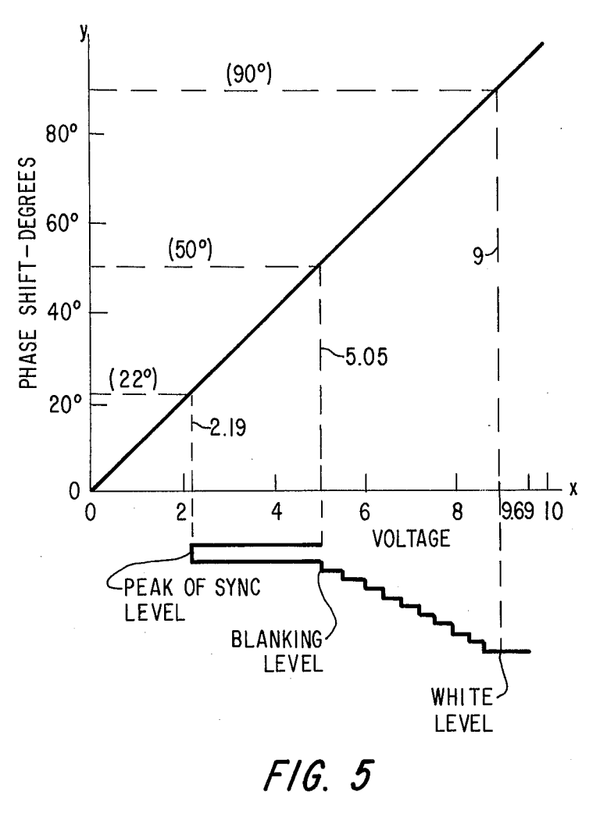
FIG. 5 is a plot of voltage input vs. phase shift of phase modulator 33 in FIG. 1.

Referring to FIG. 5, there is illustrated the phase shift in the phase modulator 33 for the output signal from video processor 37. The white level signal at 9 volts from the video processor 37 produces 90° phase shift at the phase modulator 33. A blanking level signal at 5.05 volts from the video processor 37 produces about 50° phase shift at modulator 33. The peak-of-sync level signal from the video processor 37 of 2.19 volts produces about 22° phase shift in the phase modulator 33. The steps between the white level and blanking level in FIG. 5 represent signal intelligence information levels which produce a phase shift in the range 90° to 50°. In addition to the above processing, the processors 35 and 37 can be further adjusted to correct for non-linearities introduced in the overall system.

Figure 6:
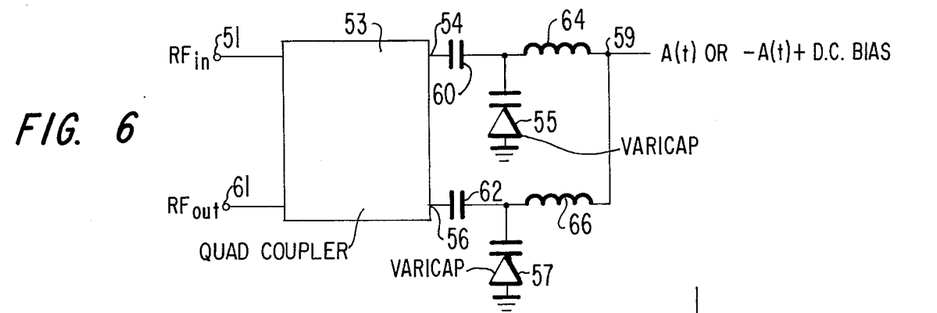
FIG. 6 is a schematic diagram of a phase modulator according to the embodiment shown in FIG. 1.

The phase modulators 31 and 33 may be of the type illustrated in FIG. 6. The RF input signal of sin $[9\omega_0 t - \beta(t)]$ from filter 29 is applied to a 3 db, 90° coupler or quadrature coupler 53 at input terminal 51. One half of the signal is coupled out of port 54 and one half of the signal is coupled out of port 56. The one half of the signal that is coupled out of port 54 is applied via coupling capacitor 60 across variable capacitor diode 55, and the one half of the signal coupled out of port 56 with a 90° difference in phase is applied via coupling capacitor 62 across variable capacitor diode 57. The diodes 55 and 57 are always back biased by a direct current signal coupled via terminal 59. Also applied to terminal 59 is either the $+A(t)$ or $-A(t)$ signal discussed above which by the operation of the varicaps 55, 57 phase modulates the input RF signal. Inductances 64 and 66 in the circuit are arranged to isolate the RF circuit from the video circuits (RF choke). The variable capacitor diodes 55 and 57 cause a phase shift of the input signal as a function of either the $+A(t)$ or $-A(t)$ signal as discussed previously, and the total phase modulated signal is applied through the coupler 53 to output terminal 61. The coupling capacitors 60 and 62 serve to isolate the D.C. bias from the RF circuits. It is desirable that the type of phase modulator used provide constant group delay such as the dispersive type illustrated. A further description of this dispersive phase modulator may be found in a book entitled "Microwave Semiconductor Devices and Their Circuit Applications" edited by H. A. Watson and published by McGraw Hill. The dispersive phase modulator is more specifically described on pages 331–334.

The phase modulated output from modulator 31 is coupled via the adjustable phase shifter 38 and the non-linear amplifier 39 to the four diode mixer 41. The output from the phase modulator 31 for the specific example illustrated in FIG. 4 may be represented as sin $[9\omega_0 t - \beta(t) - \arccos E(t) + 105°]$. (The 105° represents for the arrangement in FIG. 4 where at peak of sync the relative phase is 90° the addition of one half or 15° of the 30° offset discussed above.) Similarly, the phase modulated output from modulator 33 is coupled via the non-linear amplifier 43 to the diode mixer 45. The output from phase modulator 33 for the specific example illustrated in FIG. 5 may be represented as sin $[9\omega_0 (t) - \beta(t) + \arccos E(t) + 7°]$. (The 7° represents for the arrangement in FIG. 5 where at the peak of sync signal level the relative phase is 22°, the addition of one half or −15° of the 30° offset discussed above.) The amplifiers 39 and 43 may provide, for example, 15 db gain and, since the signals processed thereby are phase modulated, the amplifiers 39 and 43 need not be linear.

Figure 7:
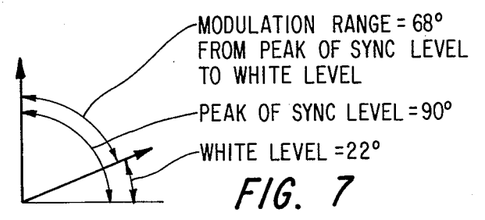
FIG. 7 is a vector diagram illustrating the phase of the output signal from phase modulator 31 in FIG. 1.
Figure 8:
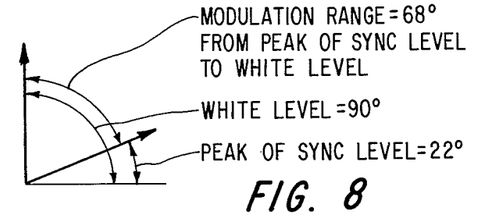
FIG. 8 is a vector diagram illustrating the phase of the output signal from phase modulator 33 in FIG. 1.

Referring to FIG. 7, there is illustrated be vectors the phase of the output from the phase modulator 31. At the phase modulator 31, a 90° phase shift occurs for the peak-of-sync level signal, a 22° phase shift occurring for the white level signal. See FIG. 4. Referring to FIG. 8, there is illustrated by vectors the phase of the output from the phase modulator 33. In this case, a 22° phase shift occurs for the peak-of-sync level signal, and a 90° phase shift occurs for the white level signal. Thus, in the example given, the input video signal peak-to-peak voltage swing must be determined to produce at a phase modulator a 68° phase shift between peak-of-sync at 100% modulation and the white level at 12.5% modulation. The adjustable phase shifter 38 is required to be set in this example to retard the phasing of the path including modulator 31 to the output terminal 74a of combiner 74 98° relative to the phasing of the path including modulator 33 to the output terminal 74a of the combiner 74 to set the two peak-of-sync level signals at 30° out of phase with each other at the combiner 74 output. For the example given above, where the combiner 74 provides an extra −90° relative phase, the phase shifter 38 need only to retard the phase 8°, with the path including modulator 33 being coupled to that terminal of the coupler providing the −90° relative phase shift. The output from the phase shifter 38 may for this specific example be represented as sin $[9\omega_0 t - \beta(t) - \arccos E(t) + 97°]$. Phase shifter 38 is also set to correct for any relative phase difference, other than that required for optimum performance, between the two signal paths after amplitude limiter 27.

To achieve the final carrier frequency, a desired visual carrier frequency $F_r + 9F_0$ is applied to the diode mixers 41 and 45. This may be achieved as shown in FIG. 1, for example, by mixing at mixer 67 signals from source 53 of desired visual carrier frequency $F_r$ with a signal source of frequency $9F_0$. A filter 70 at the output of mixer 67 selects those signals at the frequencies $F_r + 9F_0$ and passes them to the diode mixers 41 and 45. The source of the signal at frequency $9F_0$ applied to the mixer 67 may be derived by mixing the output of frequency miltiplier 23 at $10F_0$ and the output from oscillator 15 of $F_0$ at a mixer 68 and coupling the difference frequency via a selective filter 69 to the mixer 67. The diode mixers 41 and 45 may be like that described above in connection with mixer 21. The operation of the mixers 41 and 45 produces a reversal in the sense of the phase of the respective signals (from 97° to −97° in the path through mixer 41 and from 7° to −7° in the path through mixer 45). The output from diode mixer 41 is applied via selective filter 71 and non-linear amplifiers 73 to one input of the combiner 74. The filter 71 passes the frequency $F_r \pm$ the sidebandds to the combiner 74. Similarly, the output of the diode mixer 45 is coupled through a select filter 75 and non-linear amplifiers 77 to the second input of the combiner 74. The filter requirements for filters 71 and 75 depend upon the television channel. Channel 7 in the IF television frequency band imposes the most stringent filtering requirements. One such filter may be a five pole Chebyshev with a 3 db bandwidth of 31 MHz. It is desirable to keep the insertion loss down to 1 db and the ripple to 0.01 db. The amplifiers 73 and 77 do not have to be linear. In an effort to make the system as solid state as possible most of the amplification should be done at this point.

The output signals from the mixer 41 may then be represented as $$\sin [\omega_r t + \beta(t) + \arccos E(t) - 97°].$$

The output signals from the mixer 45 may then be represented as $$\sin [\omega_r t + \beta(t) - \arccos E(t) - 7°].$$

Assuming that an additional −90° shift is accomplished at the combiner 74 rather than at the phase shifter 38 as previously discussed, the output signal of the combiner may be represented as follows:

$A \sin [\omega_r t + \beta(t) + \text{arc cos } E(t) - 97°] + A \sin [\omega_r t + \beta(t) - \text{arc cos } E(t) - 97°] = 2A \cos [\text{arc cos } E(t)] \sin [\omega_r t + \beta(t) - 97°] = 2A \{E(t) \sin [\omega_r t + \beta(t) - 97°]\}.$ The fixed phase angle of 97° resulting from the specific example of the relative phase shifts established at the various points in the system are discussed above.

Figure 9:
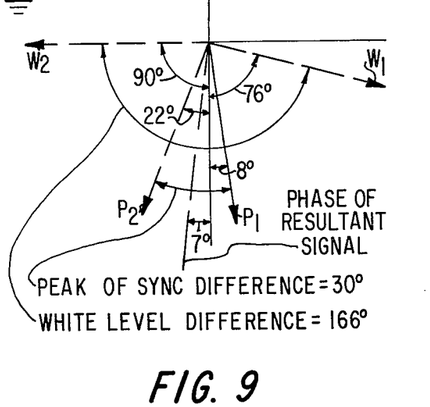
FIG. 9 is a vector diagram illustrating the phase of the output signals at the combiner output of FIG. 1.

The two signals at the combiner 74 add vectorially as illustrated in FIG. 9. The dashed line vector labeled W₁ in FIG. 9 represents the phase of the white level signals over the first path including phase shifter 38 and the dashed line vector labeled W₂ represents the phase of the white level signals over the path including modulator 33. The vector labeled P₁ represents the phase of the peak-of-sync level signal over the first path including phase shifter 38 and the vector labeled P₂ represents the phase of the peak-of-sync level over the path including modulator 33. At peak-of-sync the output signals are at a relative phase difference of 30°. As the envelope detected signal goes to the white level the two output signals track in the opposite phase sense such that at the white level these signals are about 166° out of phase and provide 12.5% modulation.

Figure 10:
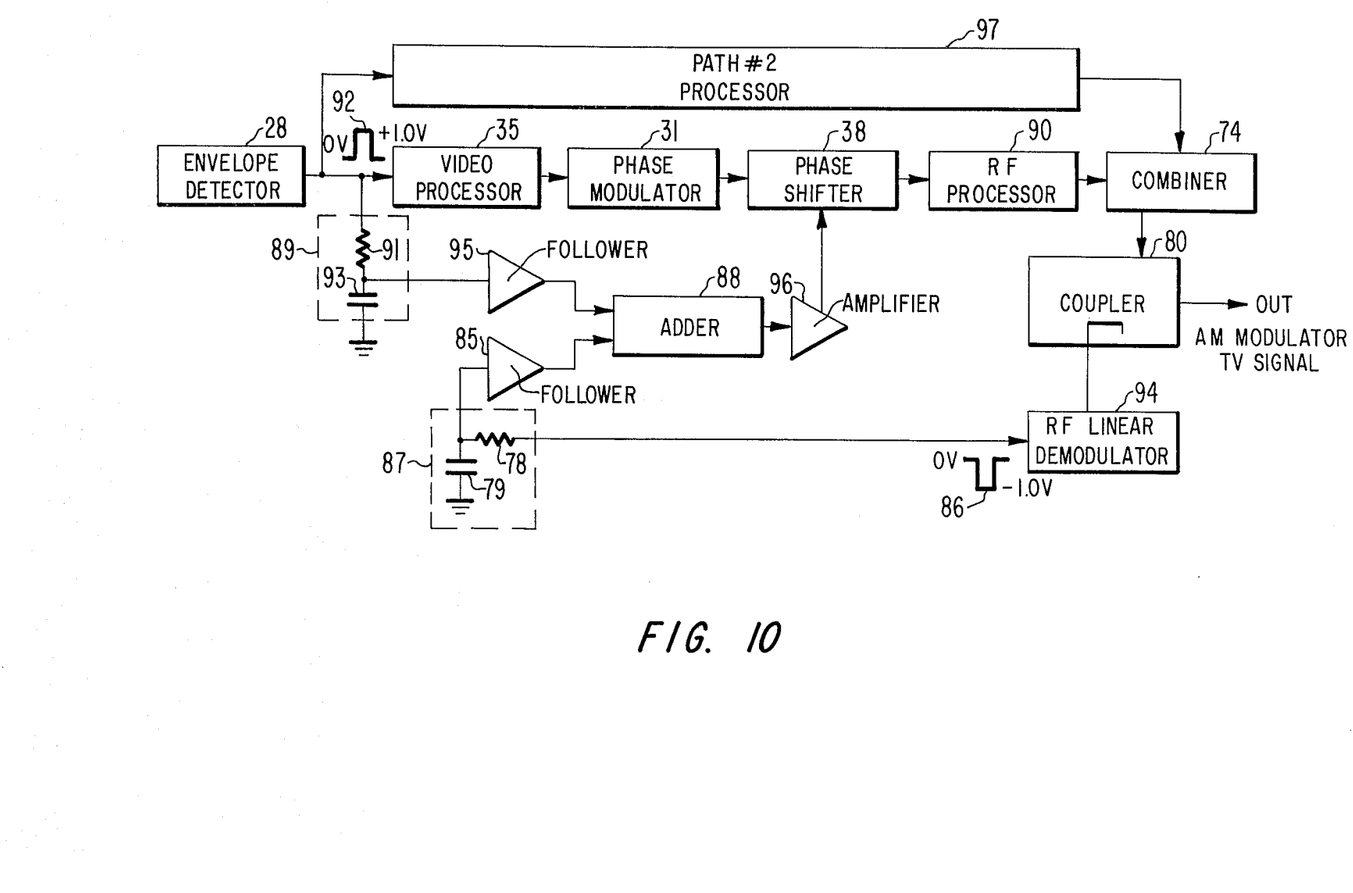
FIG. 10 is a diagram of a phase feedback control system.

Referring to FIG. 10, there is illustrated a system which when added to a system like that in FIG. 1 maintains the desired relative phase between the two signals combined at combiner 74 in FIG. 1. A first signal path includes the phase modulator 31, video processor 35, phase shifter 38 and an RF processor 90. RF processor 90 includes amplifier 39, mixer 41, filter 71 and amplifiers 73 as shown in FIG. 1. A second path labeled Path No. 2 processor 97 in FIG. 10 includes video processor 37, phase modulator 33, amplifier 43, mixer 45, filter 75 and RF amplifiers 77 as shown in FIG. 1. Referring to FIG. 10, a directional coupler 80 is provided. A sample of the signal at the output of combiner 74 is coupled by the coupler 80 to a linear RF demodulator 94. The RF demodulator 94 may include a diode biased to operate in the linear region over the video signal range. This demodulator in the present example is arranged to provide a negative going signal with increases in amplitude of the output signal. For example, as the detected signal goes from zero to the peak-of-sync signal level, the output of the demodulator 94 goes from zero to −1.0 volts as indicated by signal 86 in FIG. 10. The detected, negative going output from demodulator 94 is coupled to an averaging RC network 87. An average value of the detected output signal is obtained by making the RC network a relatively long time constant network. Resistor 78 and capacitor 79 illustrated in FIG. 10 form that network. A voltage follower 85 is driven from the network 87. The output from the voltage follower 85 is applied to an adder 88.

The signal at the output of the envelope detector 28 and ahead of the video processor 35 is sampled. The average value of the detected signal is obtained by a long time constant network 89 comprising resistor 91 and capacitor 93. The time constants of networks 87 and 89 are the same. These RC time constants should be long as compared to changes in the signal content. For example, the resistors 78 and 91 may be 5 megohms resistors and capacitors 79 and 93 may be 1 micorfarad capacitors to give an RC time constant of 5 seconds. A voltage follower 95 is provided to isolate the capacitor 93 from the adder 88. The output signal from the envelope detector 28, for example, is a signal 92 with an increasing positive voltage from zero reference as the envelope output increases toward +1.0 volts at the peak-of-sync signal level. The adder 88 compares the average signal levels at the two inputs to provide an output difference error signal. This error signal is amplified and applied to the control terminal of the phase shifter 38. The amplifier 96 provides sufficient amplitude to the detected error signal to swing the phase shifter 38 the proper amount to maintain the relative phase of the two signal paths. This phase shifter 38 may be a dispersive type of phase shifter as described in a book entitled "Microwave Semiconductor Devices and Their Circuit Applications" edited by H. A. Watson and published by McGraw-Hill. The D.C. bias initially applied to this phase shifter device provides the required phasing to achieve the selected phase difference at peak-of-sync as per the first arrangement discussed in connection with FIG. 1. This setting for the example above was 8°. The output from the amplifier 96 varies this D.C. bias level and thus the degree of phase shift.

In the operation of the system described in connection with FIG. 10, if the circuits in path No. 1 including the phase modulator 31 produce a phase advance in that signal relative to the signal over path No. 2, including phase modulator 33, the average level of the RF output signal sensed at directional coupler 80 decreases. A comparison of this output signal level, when averaged, with the averaged signal level of the signal at the envelope detector 28 generates a net positive signal that when amplified through amplifier 96 causes the phase shifter to retard path No. 1 a compensating amount. If the circuits in path No. 1 retard the signal phase relative to the signal over path No. 2, the average level of the sensed RF output signal increases. A net negative signal output (opposite sign) is provided, and this causes the phase shifter 38 to be set to advance the signal phase of path No. 1 a compensating amount. If the circuits of path No. 2 advance the signal phase relative to the signal over path No. 1, the average level of the sensed RF output signal increases. As in the second case above, this error signal causes an advance of the signal phase over path No. 1 until the desired phase relationship of the two paths is established. If the circuits of path No. 2 retard the signal phase relative to the signal over path No. 1, the average level of the sensed RF output power decreases. As in the first case above, the error signal causes the signal phase of path No. 1 to be retarded a compensating amount. The amplifier 96 may preferably be a limited amplifier to prevent in the case of a loss of signal the overdriving of the phase shifter to the point the system locks up to an incorrect phase.

Figure 11:
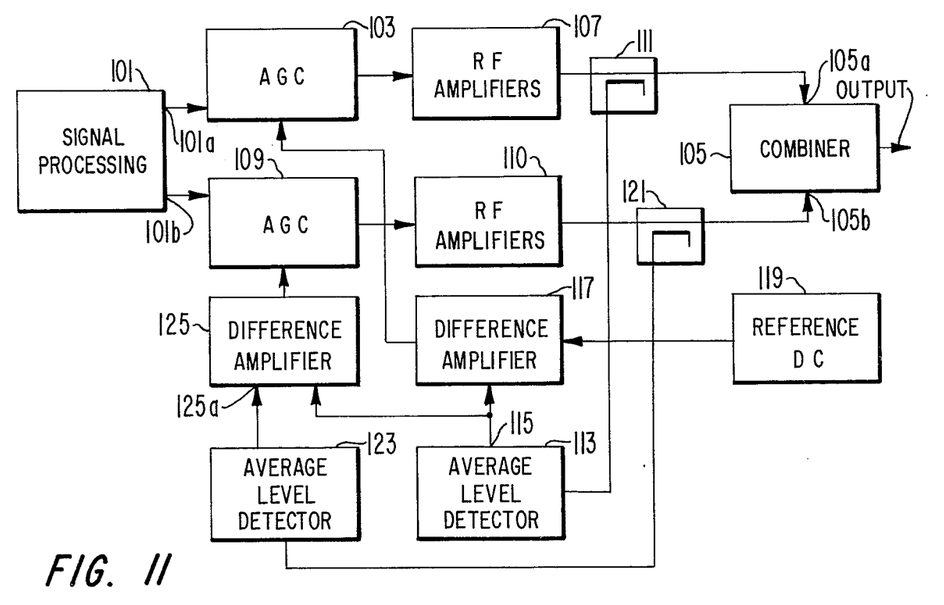
FIG. 11 is a block diagram of a system for controlling the absolute and relative power levels at the summation point of a phase-to-amplitude modulation system.

In a phase-to-amplitude modulation system where two phase modulated signals are amplified and added to provide an amplitude modulated signal, the amplitude levels of the two signals to be combined, relative to each other, must be maintained within a certain limit. Referring to FIG. 11, a system is illustrative for maintaining the relative levels of the two signals to be combined and also to maintain the absolute level of the output signal. A signal processor 101 may be like that surrounded by the dashed lines in FIG. 1 where the output frequency is at $9F_0$. If the desired output frequency is $F_r$, the signal processor 101 includes the diode mixers 41 and 45 and the filters 71 and 75 in FIG. 1. Included in the first signal path between the output of the signal processor 101 (at terminal 101a) and the combiner 105 is an automatic gain control (AGC) circuit 103 and RF amplifiers 107. The RF amplifiers may be like that described in connection with amplifiers 73 in FIG. 1. The second signal path extends from signal processor 101 (at terminal 101b) through a second automatic gain control (AGC) circuit 109 and RF amplifiers 110 to combiner 105. The RF amplifiers 110 may be like that described in connection with amplifiers 77 in FIG. 1. Between the RF amplifiers 107 and the one input terminal 105a of combiner 105 is located a coupler 111, which may be a directional coupler. This coupler couples a sample of the signal processed over the first path to an average level detector 113. The average level detector 113 produces a signal at the output 115 which is proportional to the average level of the signal in the first path to terminal 105a of combiner 105. Average level detectors are used, rather than envelope or peak detectors, to insure that any incidental amplitude modulation on the signals does not effect the level measurement. The DC (direct current) output from detector 113 is applied to a difference amplifier 117 and is compared to a reference DC level from reference source 119 coupled to the other input terminal of difference amplifier 117. At the difference amplifier 117, the amplified difference between the detected DC output signal from the average level detector 113 and the reference DC level is applied to the AGC circuit 103. The AGC circuit 103 is controlled such that when the signal level in the first path increases above the controlled level the DC output from the detector 113 increases and the error signal at the output of the difference amplifier increases, reducing the gain of the first path through AGC circuit 103. This AGC circuit 103 may be a PIN diode circuit with the increased error signal described above causing increased forward conductivity of the PIN diode. Similarly, if the detected level at detector 113 falls below that of the reference signal, a signal of opposite sense is coupled to the AGC circuit 103, causing increased gain in the first path through AGC circuit 103.

A second sampling coupler 121 is coupled between RF amplifiers 110 and terminal 105b of combiner 105. This coupler 121 may again be a directional coupler. The output of the directional coupler 121 is coupled to a second average level detector 123. The second average level detector 123 produces a DC signal at its output that is proportional to the average level of signals in the second path. The DC output is applied to a first terminal 125a of a differential amplifier 125. The output of average level detector 113 is coupled to the second input of the difference amplifier 125. The output from difference amplifier 125 is an amplified signal proportional to the difference between the average level detected at detectors 123 and 113. The amplified difference signal from difference amplifier 125 controls the gain in the AGC circuit 109. If the level of the signal in the second path increases relative to that of the signal in the first path, the error signal increases and consequently a reduced gain in the second path occurs. If the level in the second path is decreased, the error signal decreases, causing an increase in the gain in the second path. Again, the AGC circuit 109 may be a PIN diode attenuator. The average detectors may be high quality diode detectors. The difference amplifiers 125 and 117 may be operational amplifiers. It may be desirable in certain applications to include the AGC circuits 103 and 109 in the processor 101 with the outputs thereof coupled to the amplifiers 39 and 43 of FIG. 1.

What is claimed is:

1. In combination, means for amplitude modulating a radio frequency carrier signal with an input signal, vestigial sideband filtering and delay equalizing means coupled to said modulating means for providing a delay equalized vestigial sideband filtered amplitude modulated signal, envelope detecting means responsive to said filtered signal for providing an output signal which varies in amplitude according to the envelope of said filtered signal, amplitude limiter means responsive to said filtered signal for amplitude limiting said delay equalized vestigial sideband filtered amplitude modulated signal, phase modulating means responsive to said amplitude limited signal and to said output signal of said envelope detecting means to provide a first phase modulated output signal having a phase determined according to the arc cosine of the output signal of said envelope detecting means normalized with unity at the maximum possible level thereof, said phase modulating means providing a second phase modulated output signal having a phase determined according to the - arc cosine of the output signal of said envelope detecting means normalized with unity at the maximum possible level thereof, and means coupled to said phase modulating means for combining said first and second output signals from said phase modulating means in a manner to provide an amplified, delay equalized vestigial sideband filtered amplitude modulated signal.

2. The combination claimed in claim 1 including a phase shifter coupled between one of the first and second outputs from said phase modulating means and said combining means for adjusting the relative phase of said two phase modulated signals at the combining means to achieve a selected phase difference therebetween.

3. The combination claimed in claim 2 including means for comparing the signal level at the output of said combining means with the signal level at the output of said envelope detecting means to provide an error signal where one exceeds the other a given amount, and means for operating said phase shifter in response to said error signal to shift the phase of one of said phase modulated signals to maintain the said selected relative phase difference.

4. The combination claimed in claim 3 wherein said signal level comparing means includes a first average value detector connected to produce a first detected signal according to the signal level at the output of said combiner and a second average value detector connected to produce a second detected signal according to the signal level at the output of said envelope detecting means, and means for adding said first and second detected signals to produce said error signal for operating said phase shifter.

5. The combination claimed in claim 1 and including, means for deriving a first signal according to the amplitude level of one of said phase modulated signals, means for comparing said first signal with a reference and for determining the level of said one phase modulated signal according to that comparison, means for deriving a second signal according to the amplitude level of the other of said phase modulated signals, and means for comparing said first and second signals and for determining the level of said other phase modulated signal according to said last-mentioned comparison.

6. The combination claimed in claim 5, and wherein said means for deriving said first signal includes an average level detector,
a first difference amplifier responsive to said first signal and to a reference signal for producing an error signal according to the difference therebetween,
means for determining the amplitude level of said one phase modulated signal according to said error signal,
said means for deriving said second signal includes a second average level detector,
a second difference amplifier responsive to said first and second average level detected signals for producing a second error signal according to the difference therebetween, and
means for determining the amplitude level of said other phase modulated signal according to said second error signal.

7. An amplitude modulation system for use in a broadcast transmitter comprising, in combination,
means for amplitude modulating a radio frequency carrier signal of a first frequency F with an input signal,
means coupled to said modulating means for providing a delay equalized vestigial sideband filtered amplitude modulated signal of said first frequency F,
first frequency converting means for converting said filtered signal of said first frequency to a signal of a second frequency of N times said first frequency,
envelope detecting means responsive to said signal of frequency NF for providing an output signal which varies in amplitude according to the envelope of said filtered signal,
amplitude limiter means responsive to said signal of frequency NF for amplitude limiting said delay equalized vestigial sideband filtered amplitude modulated signal,
phase modulating means responsive to said amplitude limited signal and to said output signal of said envelope detecting means to provide at a first output a first phase modulated output signal having a phase determined according to the arc cosine of the output signal of said envelope detecting means normalized with unity at the maximum possible level thereof, said phase modulating means providing at a second output a second phase modulated output signal having a phase determined according to the - arc cosine of the output signal of said envelope detecting means normalized with unity at the maximum possible level thereof,
second frequency converting means coupled to the first output of said phase modulating means for converting said first phase modulated signal of said second frequency NF to a third frequency,
third frequency converting means coupled to the second output of said phase modulating means for converting said second phase modulated signal of said second frequency NF to said third frequency, and
means coupled to said second and third frequency converting means for combining said first and second phase modulated signals of said third frequency in a manner to provide an amplified, delay equalized vestigial sideband filtered amplitude modulated signal of said third frequency.

8. An amplitude modulating system as claimed in claim 7 and including,
a first non-linear amplifier coupled between said first output of said phase modulating means and said second frequency converting means to amplify said first phase modulated signal of said second frequency, and
a second non-linear amplifier coupled between said second output of said phase modulating means and said third frequency converting means to amplify said second phase modulated signal of said second frequency.

9. An amplitude modulation system as claimed in claim 7 and including,
a first non-linear amplifier coupled between said second frequency converting means and said combining means to amplify said first phase modulated signal of said third frequency, and
a second non-linear amplifier coupled between said third frequency converting means and said combining means to amplify said second phase modulated signal of said third frequency.

10. An amplitude modulation system as claimed in claim 7 wherein N is nine.

11. An amplitude modulation system as claimed in claim 7 and including,
a phase shifter coupled between one of the first and second outputs from said phase modulating means and said combining means for adjusting the relative phase of said two phase modulated signals at the combining means to achieve a selected phase difference therebetween.

12. In a phase to amplitude modulation system of the type wherein a signal is separately phase modulated by two phase modulators and the phase modulated signals are coupled over separate first and second paths to a combiner whose single output is an amplitude modulated signal, an arrangement for controlling the relative amplitude levels of the two phase modulated signals combined at the combiner comprising:
means for deriving a first signal according to the amplitude level of one of said phase modulated signals,
means for comparing said first signal with a reference and for determining the level of said one phase modulated signal according to that comparison,
means for deriving a second signal according to the amplitude level of the other of said phase modulated signals, and
means for comparing said first and second signals and for determining the level of said other phase modulated signal according to said last-mentioned comparison.

13. In a phase to amplitude modulation system as claimed in claim 12 and wherein
said means for deriving said first signal includes an average level detector,
a first difference amplifier responsive to said first signal and to a reference signal for producing an error signal according to the difference therebetween,
means for determining the amplitude level of said one phase modulated signal according to said error signal, said means for deriving said second signal includes a second average level detector, a second difference amplifier responsive to said first and second average level detected signals for producing a second error signal according to the difference therebetween, and means for determining the amplitude level of said other phase modulated signal according to said second error signal.

14. In a phase to amplitude modulation system of the type wherein an input signal is separately phase modulated by two phase modulators and the phase modulated signals are coupled over separate first and second paths to a combiner whose single output is an amplitude modulated signal, an arrangement for determining the relative phase of said two phase modulated signals to maintain a selected phase difference therebetween at the combining means comprising, a phase shifter included in one of said paths between the respective one of said phase modulators and said combiner, means for comparing the signal level at the output of said combiner with the level of said input signal to provide an error signal where one exceeds the other a given amount, and means for operating said phase shifter in response to said error signal to alter the relative phase of said phase modulated signals to maintain said selected phase difference therebetween.

15. In a phase to amplitude modulation system as claimed in claim 14 and wherein said signal level comparing means includes a first average value detector connected to produce a first detected signal according to the signal level at the output of said combiner and a second average value detector connected to produce a second detected signal according to said input signal level, and means for adding said first and second detected signals to produce said error signal for operating said phase shifter.

* * * * *